United States Patent [19]

Hauser et al.

[11] Patent Number: 5,736,909

[45] Date of Patent: Apr. 7, 1998

[54] MONOLITHIC CONTINUOUS-TIME ANALOG FILTERS

[75] Inventors: Max Hauser, Sunnyvale, Calif.; Gerrit Groenewold, Valkenswaard, Netherlands

[73] Assignee: Philips Electronics North America Corporation, N.Y., N.Y.

[21] Appl. No.: 595,531

[22] Filed: Feb. 2, 1996

[51] Int. Cl.[6] .................................................. H03H 7/30
[52] U.S. Cl. .................................... 333/166; 333/139
[58] Field of Search ........................ 333/28 T, 28 R, 333/138, 139, 166

[56] References Cited

U.S. PATENT DOCUMENTS 4,291,286 9/1981 Wagner ................................ 333/166
5,357,224 10/1994 Sterzer ............................. 333/166 X

FOREIGN PATENT DOCUMENTS

86943 8/1983 European Pat. Off. ............. 333/166

*Primary Examiner*—Robert Pascal
*Assistant Examiner*—Justin P. Bettendorf

[57] ABSTRACT

A continuous-time analog filter receiving a continuous-time analog input signal is provided. The filter utilizes a plurality of delay cells for receiving the input signal, and then processes the input signal through taps having specific weight values. The signal is multiplied by the weight factors and then summed to produce a continuous-time analog output signal.

33 Claims, 10 Drawing Sheets

MONOLITHIC CONTINUOUS-TIME ANALOG FILTERS

BACKGROUND OF THE INVENTION

1. Field of the Invention

The present invention relates to substantially finite impulse response (SFIR) filters. More particularly, it relates to a continuous-time analog SFIR filter.

2. The Prior Art

Conventional SFIR filters, for example transversal filters, have been implemented in many forms to achieve signal processing objectives such as the detection of signals in noise, programmable filtering and adaptive filtering.

For example, a transversal filter in its most basic form consists of a series of delay elements which form a delay line to successively delay an input signal. Taps are placed at various points along the delay line, and the signals at the taps are multiplied by individual weight factors. The weighted products are summed to form the filter output.

The most widely used implementation of such a transversal filter is a digital transversal filter. Therein, the signal is a discrete time, discrete value input where the delay elements are realized with digital memory and the weighting and addition circuits are realized with digital arithmetic.

Another established form of a transversal filter is a discrete-time analog implementation (i.e., discrete in time but continuous in signal value). All discrete-time filters (analog and digital) require a time-sampled input signal. For many applications of the transversal filter, such as bit detection from physical storage or transmission, where the input signal is a continuous time signal, the sampling requirements often compel the addition of a continuous-time analog pre-filter.

A third type of implementation is a fully analog filter (i.e., the signal within it is continuous in both time and value) which is constructed using specific physical phenomena that support traveling waves. Examples of such filters are surface-acoustic wave (SAW) and magnetostatic wave (MSW) devices. Such devices require special manufacturing techniques not used for common monolithic circuits. Also, to achieve programmable rather than fixed characteristics in these filters generally requires combining the SAW or MSW device with monolithic analog circuitry, and therefore entails a combination of multiple basic manufacturing technologies.

It is therefore desirable to provide a continuous-time programmable analog SFIR filter which includes monolithic analog filter cells to approximate time delay (constant magnitude and linear-phase versus frequency). This filter would be fully integrated using all monolithic technology. This will enable such a filter to be programmable and be realized on a single integrated circuit at reasonable cost.

A continuous-time SFIR filter is advantageous in the detection of bits encoded into an analog waveform. This is because unlike a discrete time (sampled-data) filter, which is often used in this application, the continuous-time SFIR filter precedes any time-sampling step. In effect, the continuous-time SFIR filter provides signal processing on a much finer scale, since it acts on the entire continuous input waveform. Thus, it becomes possible to exploit more of the fine structure of the input waveform.

For example, "matched" filters for bit detection (one application of SFIR filters) will tend to be insensitive to time shifts of the input data, when filtering is in continuous time, since their output waveform (which approximates the autocorrelation function of the per-bit received waveform) simply shifts in time accordingly, without loss of information. Continuous time matched filters tend to recover input-timing information automatically since the output peak's timing for each input bit indicates the time alignment of the input waveform (unlike the timing of the input waveform's peak). This property is lost with sampled data filtering because of the mathematical property that sampling is a linear, but not a time-invariant operation. Also, timing recovery that adjusts the sampling moment in response to received data is rendered easier when the sampling point occurs as late in the signal path as possible.

SUMMARY OF THE INVENTION

In accordance with the invention, an SFIR filter includes a plurality of analog delay cells for receiving a continuous-time analog input signal. Taps are brought out from the delay-cell outputs so as to afford a plurality of differently delayed replicas of the input signal. The signals at the taps are multiplied by weights and the results of these multiplications are summed to provide a continuous-time analog output signal. The SFIR filter can be produced using any of a number of conventional monolithic fabrication processes so that the filter can be realized as a single IC. The SFIR filter may also be produced using commercial non-monolithic processes.

Accordingly, it is an object of the present invention to provide a continuous-time analog filter affording a continuous-time analog filtered output signal in response to a continuous-time analog input signal without any additional filtering or sampling.

It is another object of the invention to provide a SFIR filter in which the delay parameters and tap weights are user-programmable so that the filter is operative in a wide variety of applications.

It is a further object of the invention to provide a SFIR filter which is fabricated on a single IC using a standard monolithic fabrication process.

Still other objects and advantages of the invention will in part be obvious and will in part be apparent from the specification.

BRIEF DESCRIPTION OF THE DRAWINGS

Other objects and features of the present invention will become apparent from the following detailed description considered in connection with the accompanying drawings which disclose several embodiments of the present invention. It should be understood, however, that the drawings are designed for the purpose of illustration only and not as a definition of the limits of the invention.

In the drawings, wherein similar reference characters denote similar elements throughout the several views.

DETAILED DESCRIPTION OF PREFERRED EMBODIMENTS

The invention is directed to a SFIR filter which achieves a substantially finite (duration) impulse response, to the extent that it is built from sub-circuits which themselves achieve a substantially finite impulse response. The embodiments which follow show various examples of such filters.

Figure 1:
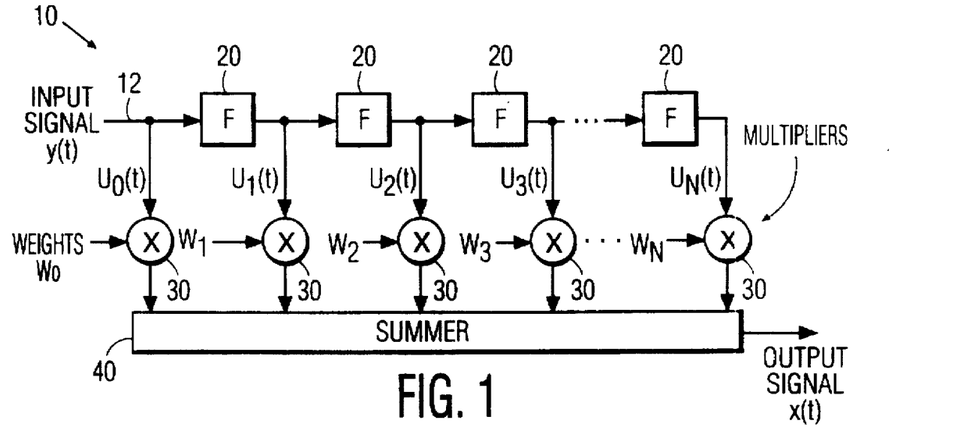
FIG. 1 is a block diagram of a transversal implementation of a SFIR filter in accordance with the invention.

FIG. 1 shows a block diagram of an SFIR filter in accordance with a first embodiment of the invention. Filter 10 is a transversal filter arranged in a serial implementation. The input signal y(t) received at input terminal 12 may be in the physical form of a voltage or current. The structure of each delay cell 20 will be discussed below in greater detail. It is preferable that delay cells 20 approximate pure delay; however, it is only necessary to achieve a sequence of continuous-time internal signals $U_0(t), U_1(t), U_2(t), \ldots U_N(t)$ with sufficiently different transfer functions versus y(t). Each internal signal $U_0(t), U_1(t), U_2(t), \ldots U_N(t)$ is input to a corresponding multiplier 30, within which it is multiplied by a weight coefficient $W_0, W_1, W_2, W_3, \ldots W_N$, respectively. The weighted internal signals are then input to summing circuit 40 to generate continuous-time output signal x(t). Since each delay cell 20 is a monolithic filter, they can be combined with monolithic circuitry for multiplication and addition to realize a programmable continuous-time analog SFIR filter. Weight coefficients may be digital or analog depending on the implementation of the multipliers and the needs of the filter application. The filter response can be modified by changing either the delay through the delay cells or the weight coefficients.

Although FIG. 1 depicts identical delay cells 20, which will often be true in practice, the delay cells could just as well be individually tailored for different characteristics, such as different time delays.

Figure 2:
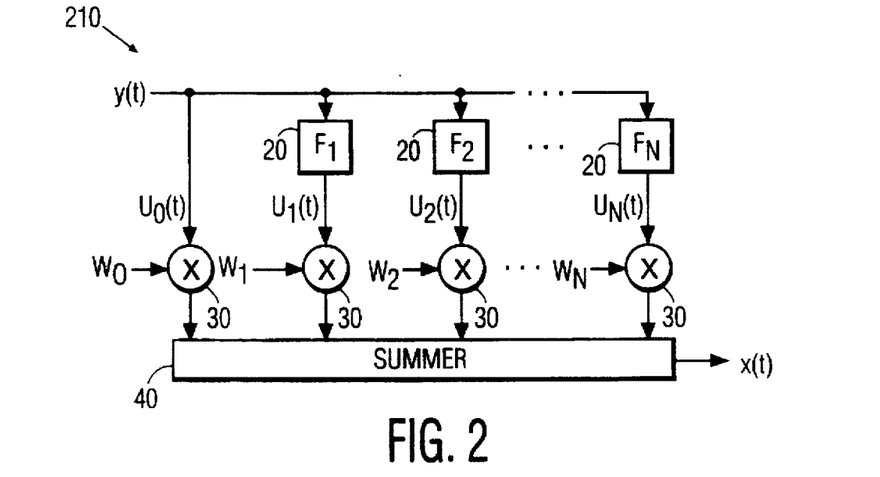
FIG. 2 is a block diagram of a parallel implementation of a SFIR filter in accordance with the invention.

FIG. 2 shows a second embodiment of a SFIR filter 210, specifically illustrating a parallel implementation thereof. The input-output capability of filter 210 is essentially the same as filter 10 except that each delay cell 20 must exhibit a unique transfer function.

Figure 3:
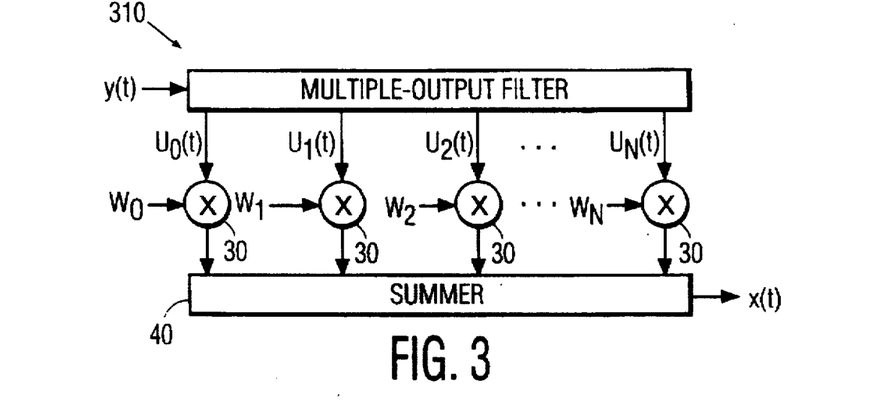
FIG. 3 is a block diagram of a more generalized implementation of a SFIR filter in accordance with the invention.

FIG. 3 depicts a third embodiment of a SFIR filter 310, specifically a filter with a multiple-output internal filter 320. Again, the input-output capability of filter 310 is essentially the same as filters 10 and 210, except that multiple output internal filter 320 receives input signal y(t) and outputs a plurality of internal signals $U_0(t), U_1(t), U_2(t) \ldots U_N(t)$. Filter 310 allows for an implementation wherein the internal filtering is not performed in either a series or parallel configuration.

Figure 4:
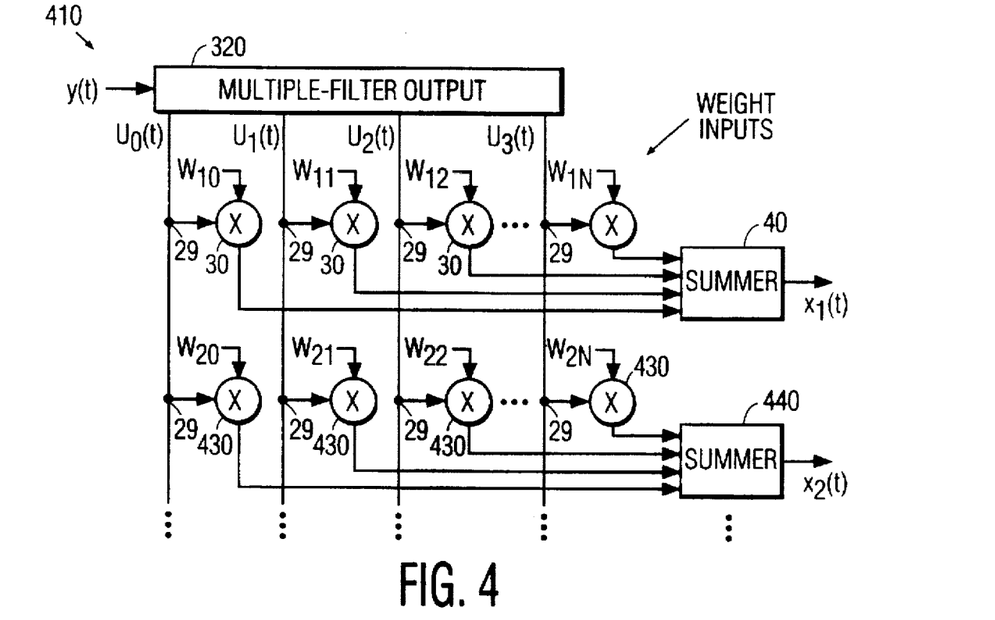
FIG. 4 is a block diagram of a further generalized implementation of a SFIR filter in accordance with the invention.

FIG. 4 shows a block diagram of a SFIR filter 410 with multiple independently programmable outputs having a multiple-output internal filter 320. Filter 410 is similar to filter 310 of FIG. 3 with multiple sets of multipliers and multiple associated summers. The signal at each tap point 29 is input to one of a plurality of multipliers 30 to be multiplied by a first weighting coefficient $W_{1n}$, and also to another multiplier 430 that is part of a different plurality, to be multiplied by a second weighting coefficient $W_{2n}$, and possibly to other multipliers from further pluralities thereof. The outputs of the multipliers 30 and 430 are added in summing circuits 40 and 440, respectively. The output of summing circuit 440 produces a second output $x_2(t)$ such that multiple filtering operations can be performed from the same filter core 320.

Figure 5:
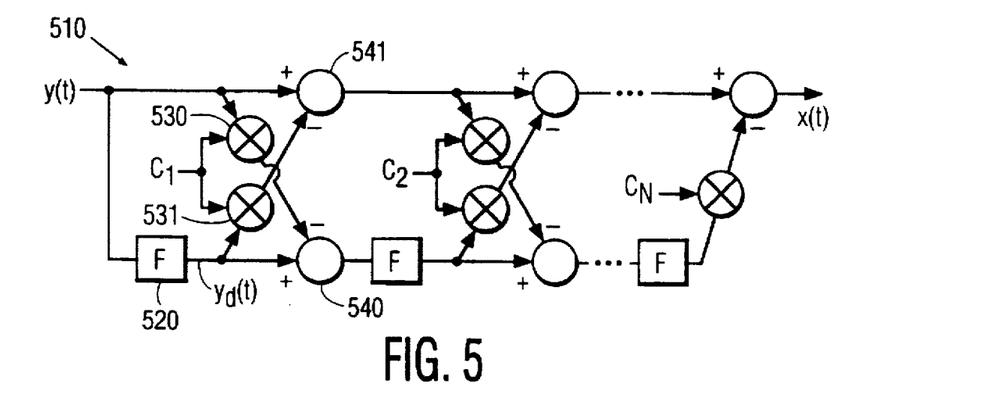
FIG. 5 is a block diagram of a lattice implementation of a SFIR filter in accordance with the invention.

FIG. 5 shows a block diagram of a SFIR filter 510 in accordance with a fourth embodiment of the invention. Filter 510 is a continuous-time lattice filter. A continuous-time input signal y(t) is input to a first delay cell 520 to realize a delayed input signal $y_d(t)$, and a first multiplier 530 wherein y(t) is multiplied by a first constant $C_1$. A second multiplier 531 multiplies delayed input signal $y_d(t)$ and first constant $C_1$. The output of first multiplier 530 and the delayed input signal $y_d$ are fed to a first differencing circuit 540 while the output of second multiplier 531 and the input signal y(t) are fed to a second differencing circuit 541. So far, this constitutes the first stage of the lattice filter. The outputs of first summing circuit 540 and second summing circuit 541 are then fed as inputs to the second stage of the filter which is identical to the first stage. Additional stages may be added depending on the filtering operation.

Delay cell 520 can function in the same manner as delay cells 20 in FIG. 1 and preferably approximates pure time delay, but this is not fundamentally necessary. Constants $C_1, C_2, \ldots C_N$ may be either analog or digital depending on the implementation of multipliers and the needs of the filter application. (Note, constants $C_1, C_2, \ldots C_N$ are weights also, like the W's in FIGS. 1 and 2)

FIGS. 1–5 illustrate some of the network structures that can form an SFIR programmable filter out of SFIR delay elements (i.e., delay cells 20, 520 and multiple output filter 320). An essential feature of these network structures is that the SFIR property of the internal filter elements (delay cells 20, 520 and multiple output filter 320), is preserved in the overall structure. If discrete-time, rather than continuous-time, circuitry were employed in circuits of FIGS. 1–5, as done in prior art, then we would achieve the well-established class of discrete-time finite-impulse-response (FIR) filters.

Figure 6:
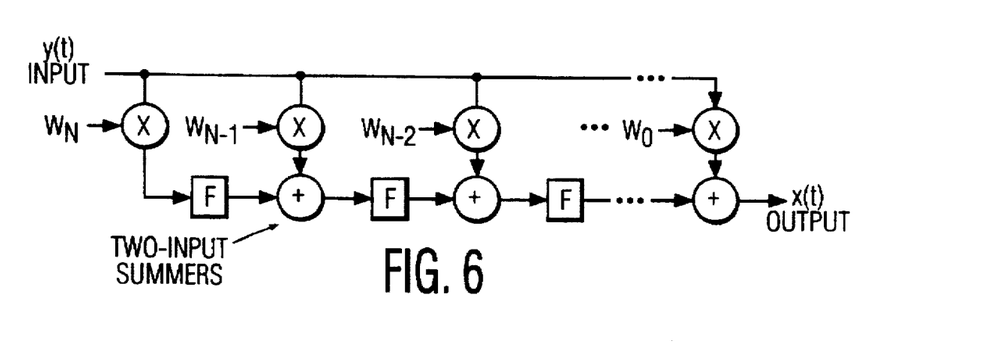
FIG. 6 is a block diagram of a transposed representation of the SFIR filter of FIG. 1.

This discrete-time prior art also includes numerous other FIR-filter structures, which can similarly inspire analogous SFIR continuous-time filters. One example of such other topologies is shown in FIG. 6. FIG. 6 represents a "transposition" of FIG. 1 in that the order of internal operations has changed, but the overall input-output relationship remains the same as in FIG. 1. Many other such topologies are possible and can be seen by analogy to the established art in discrete-time FIR filters.

FIGS. 1–6 show examples of overall, or block-level, topologies capable of realizing programmable SFIR filters in continuous time, provided that the elements in these figures can be realized. Many versions of continuous-time analog multiplier and summer elements are established in the art. What makes a complete SFIR filter feasible in monolithic form is the incorporation of practical monolithic continuous-time analog delay cells into an SFIR structure. Two classes of these cells will now be described. The first class, "distributed" delay cells, is based on exploiting and modifying the analog time delay implicit in the spatially distributed resistance and capacitance in an MOS transistor's conducting channel. The second class, "lumped" delay cells, employs monolithic active filter techniques to directly approximate pure time delay.

The "distributed" delay cells have their origin in the observation that the conducting channel in a MOS transistor, along the length between source and drain terminals, includes a continuum of resistive material in series, combined with a continuum of parallel capacitance, capacitance that is primarily returned to the gate electrode, though with additional parallel capacitance to other points including the back gate or substrate of the transistor. A voltage change at one end of this conducting channel, with respect to the gate potential, will propagate with finite speed down the length of the channel because of the time constants associated with the distributed resistance and capacitance (i.e., the distributed RC line). Overwhelmingly in the established art of MOS circuit design, this effect is considered problematic because it limits speeds in analog and digital circuits. However, the present invention seeks to deliberately exploit this distributed R-C delay effect so as to obtain a useful and electrically tunable analog time-delay filter.

Figure 7:
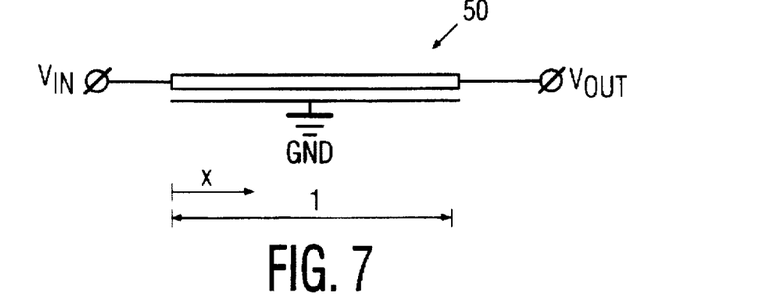
FIG. 7 is a schematic diagram of the basic structure of a distributed delay cell according to the invention.

FIG. 7 shows the basic structure of a distributed delay line 50 where 1 is the total length of the line, and x is the coordinate value along the delay line, where x=0 corresponds to the input, and x=1 corresponds to the output. The total capacitance is C, and the total resistance is R. The following equations define the properties of the delay line.

$$r = \frac{R}{l} \quad (1)$$

$$\gamma = \frac{C}{l} \quad (2)$$

where r is the resistance per unit length and $\gamma$ is the capacitance per unit length. The voltage along the line at any point can be depicted by V(x) where;

when $x = 0$ $V(0) = V_{in}$ (3)

when $x = 1$ $V(1) = V_{out}$ (4)

The solution for the distributed delay line can be found by breaking into segments of length $\Delta x$ and taking the limit for $\Delta x \to 0$:

$$V(x) = -\frac{1}{S\gamma} \lim_{\Delta x \to 0} \frac{\Delta V}{\Delta x} = -\frac{1}{S\gamma} \frac{dV(x)}{dx} \quad (5)$$

$$I(x) = -\frac{1}{r} \lim_{\Delta x \to 0} \frac{\Delta i}{\Delta x} = -\frac{1}{r} \frac{dI(x)}{dx} \quad (6)$$

eliminating $I(x)$, we get:

$$V(x) = \frac{1}{S\gamma r} \frac{d^2 V(x)}{dx^2} \quad (7)$$

By using standard methods to solve linear differential equations, and through algebraic expansion of the above formulae and solving for the respective constants, the following transfer function can be determined:

$$\frac{Vout}{Vin} = \frac{2}{e^{\sqrt{RCs}} + e^{-\sqrt{RCs}}} = \frac{1}{\cosh \sqrt{RCS}} \quad (8)$$

Figure 8:
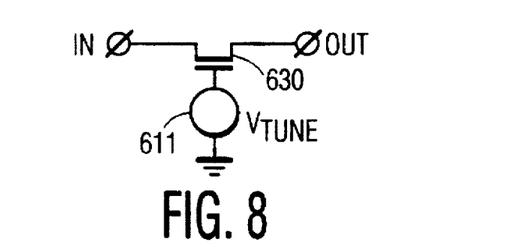
FIG. 8 is a schematic diagram of a distributed RC line implemented with a MOSFET.

FIG. 8 shows a MOSFET 630 that can be viewed as a distributed RC line, which can be used as a simple analog delay cell of the distributed type, corresponding to the delay cells 20 of FIG. 1. The source serves as the input node, and the drain serves as the output node. A voltage source 611 (Vtune) is a tuning voltage which enables the resistive characteristics of MOSFET 630 to be adjusted (and therefore the nominal delay tuned) according to the desired application. The delay cell acts as a distributed RC line when transistor 630 is operated in the ohmic or triode region, that is:

| NMOS | PMOS |
| --- | --- |
| $V_{GD} > V_T$ | $V_{GD} < V_T$ |
| $V_{GS} > V_T$ | $V_{GS} < V_T$ |

$V_T$ being equal to the threshold of the gate source voltage $V_{GS}$ required to form an inversion layer in transistor 630 and thus a conducting channel. In addition, the gate-to-channel capacitance of transistor 630 acts with the channel resistance to form the RC time constant. The channel resistance, and hence the RC time constant, is dependent on the gate source voltage $V_{GS}$ and the gate to drain voltage $V_{GD}$ (i.e., the DC bias voltages at the terminals of the MOSFET), thereby enabling the tuning of the filter response.

The transfer function (i.e., magnitude and delay characteristics) can be improved by applying feedback to the capacitive side of the distributed R-C element, in this case MOSFET 630. An example of this is shown by circuit 90 of FIG. 9.

Figure 9:
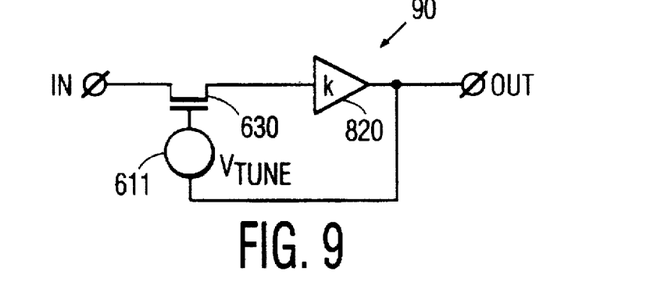
FIG. 9 is a modified schematic diagram of the distributed RC line of FIG. 8 with feedback control.

FIG. 9 shows a schematic of another embodiment of a delay cell corresponding to the delay cells 20 of FIG. 1. FIG. 9 shows the output signal of MOSFET 630 fed through voltage amplifier 820 having a gain value k. The output is then fed to the gate of transistor 630 via voltage source 611. Voltage source 611 is again used to tune the nominal delay of cell 90. Voltage source 611 can be termed a floating voltage source which is inconvenient to realize on a chip. Thus, under certain circumstances, the implementation of this scheme can be impractical. Also the bulk terminal of the MOSFET acts as a second gate and influences the frequency response. In an attempt to correct this effect, the value of k may be altered, but the accuracy of the filter may be compromised.

Figure 10:
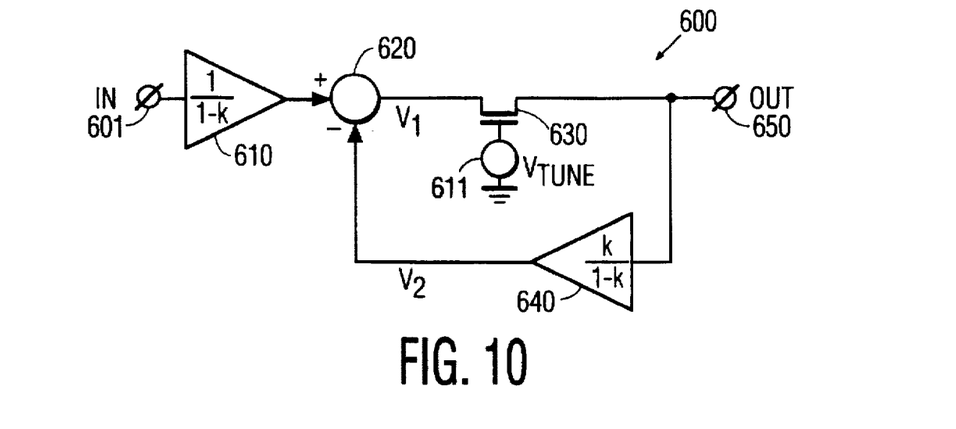
FIG. 10 is a schematic diagram of a first embodiment of a delay cell for use in accordance with the invention.

FIG. 10 shows a schematic of an alternative embodiment of a delay cell lacking the requirement for a floating tuning-voltage source. Delay cell 600 includes amplifier 610 having a gain coefficient of 1/(1−k), wherein k is a constant, coupled to a summing circuit 620. The output of summing circuit 620 is coupled to the source of MOSFET 630. The gate of transistor 630 is coupled to an adjustable DC voltage source 611 in order to properly bias transistor 630. The drain of transistor 630 is coupled to a voltage amplifier 640 in a feedback path, having a gain coefficient of k/(1−k). The output of feedback amplifier 640 is coupled to a second and sign-inverting input of summing circuit 620. An output terminal 650 is also coupled to the drain of transistor 630. Generally the gain coefficient of feedback amplifier 640 must be greater than unity which can complicate the implementation of amplifier 640 and possibly reduce the high-frequency operation of delay cell 600.

The circuit of FIG. 10 entails feedback between the source and drain of MOSFET 630, to further change the input-output transfer function. Thus, if k=0, there is no feedback and the input-output voltage relation is identical with that of the simple MOSFET, FIG. 8. Conceptually speaking, if feedback is implemented, it will provide a high frequency magnitude boost, because of the phase shift in the delay element (transistor 630). When the frequencies are such that the phase shift approaches 180°, the negative feedback changes into positive feedback, which tends to increase gain. The high-frequency magnitude boost helps to overcome the high-frequency magnitude loss entailed when a simple MOSFET is used to approximate a delay cell, as in FIG. 8.

The transfer function for the circuit of FIG. 10 can be calculated from the following:

$$V_{out} = \frac{V_1}{\cosh\sqrt{RCS}} \quad (9)$$

$$V_1 = \frac{V_{in} - V_{out} \cdot k}{1-k} \quad (10)$$

thus, $$\frac{V_{out}}{V_{in}} = \frac{1}{k + (1-k)\cosh\sqrt{RCS}} \quad (11)$$

Figure 11:
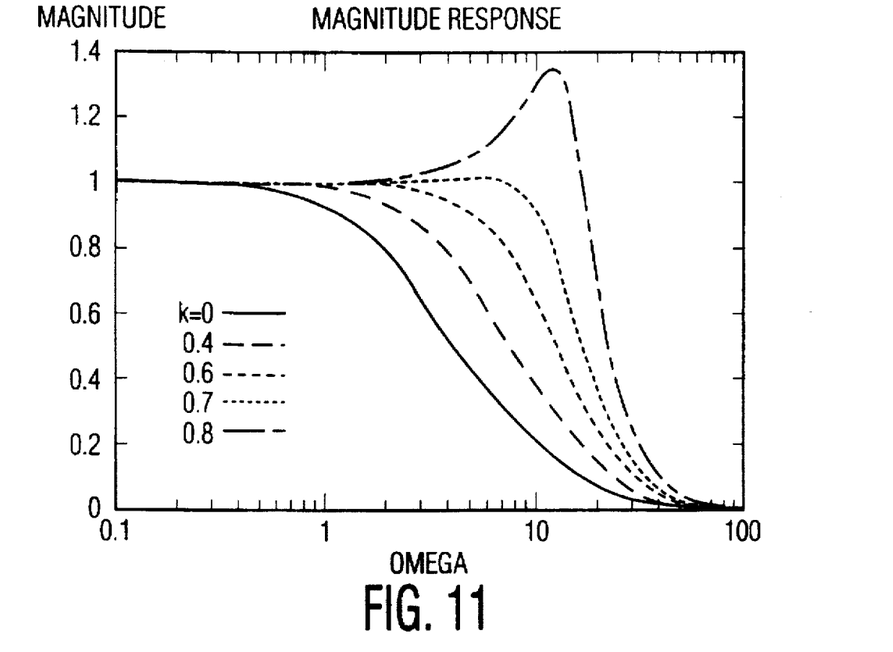
FIG. 11 is a graphical representation of the magnitude response for the delay cell of FIG. 10.
Figure 12:
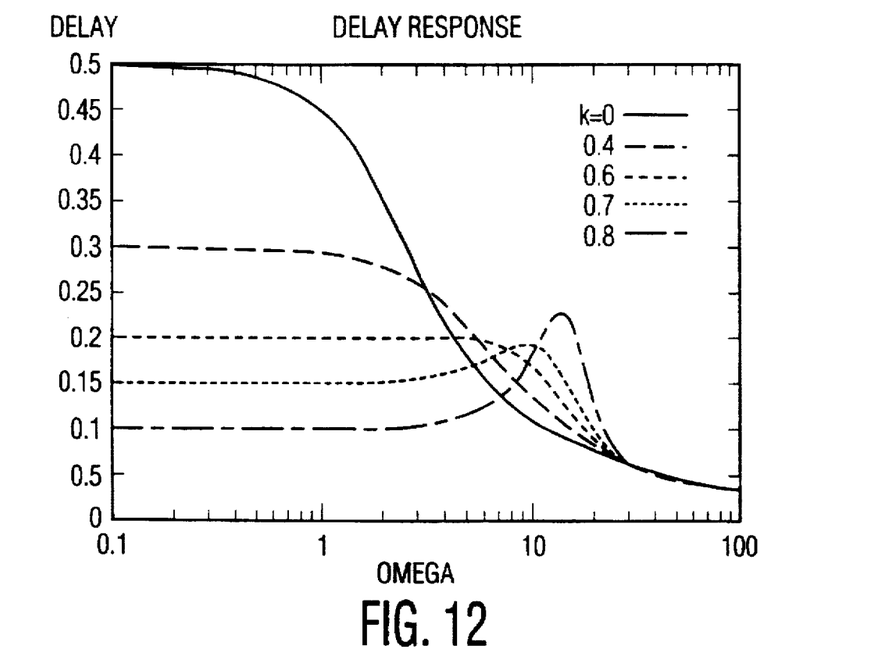
FIG. 12 is a graphical representation of the group delay response for the delay cell of FIG. 10.

FIGS. 11 and 12 show the Magnitude and Group-Delay characteristics, respectively, that result from the transfer function of the circuit of FIG. 10 for varying values of k.

Figure 13:
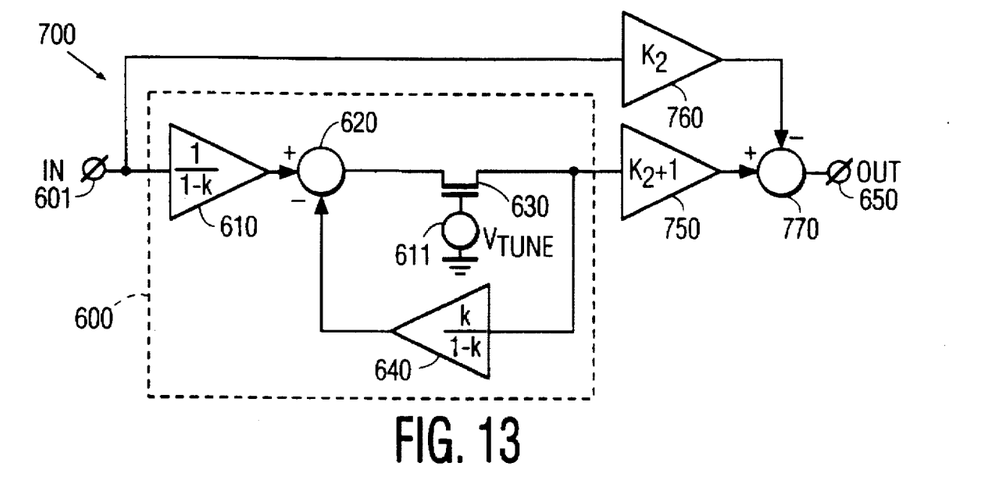
FIG. 13 is a schematic of a second embodiment of a delay cell in accordance with the invention.
Figure 14:
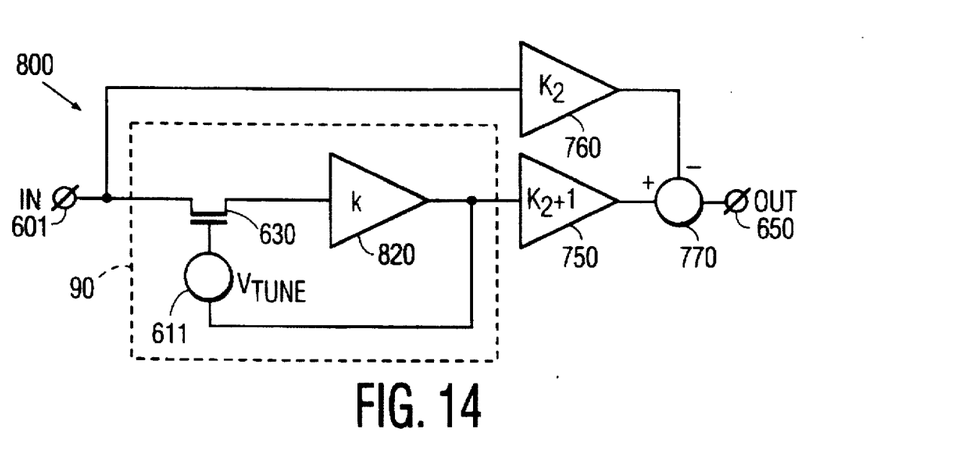
FIG. 14 is a schematic of a third embodiment of a delay cell in accordance with the invention.

The delay of a circuit such as FIG. 9 or FIG. 10 can be increased without modifying or duplicating the distributed component inside (MOS transistor 630) by a simple mathematical trick. The nominal gain magnitude from input 601 to output 650 in FIG. 10 is around unity at low frequencies and falls toward zero at high frequencies (as FIG. 11 illustrates). It is a general property of delay or phase-shift circuits having such magnitude properties that if their output is added to an inverted replica of their input, such that the algebraic sum of the two paths summed together is unity at low frequencies, then the delay or phase shift will be increased. FIGS. 13 and 14 show implementations of this idea, built around the basic delay cells of FIGS. 10 and 9, respectively. The increase in delay can be seen mathematically by calculating the transfer function of FIG. 13, for example, using the result of Equation (11) for FIG. 10. The increase can also be visualized, in the form of phase shift, by comparing polar transfer-function plots of FIGS. 10 and 13. Also the modification from FIG. 10 to FIG. 13 tends to increase the useful bandwidth of the delay cell along with the delay time of the cell.

The circuit of FIG. 13 includes delay cell 600 with the following additions. Delay cell 700 includes an amplifier 750 having a gain coefficient $k_{2+}1$, coupled between the output of delay cell 600 and a second summing circuit 770. The output of second summing circuit 770 is coupled to output terminal 650. A feedforward amplifier 760, having a gain coefficient $k_2$, is coupled between input terminal 601 and the second and sign-inverting input of summing circuit 770.

Figure 15A:
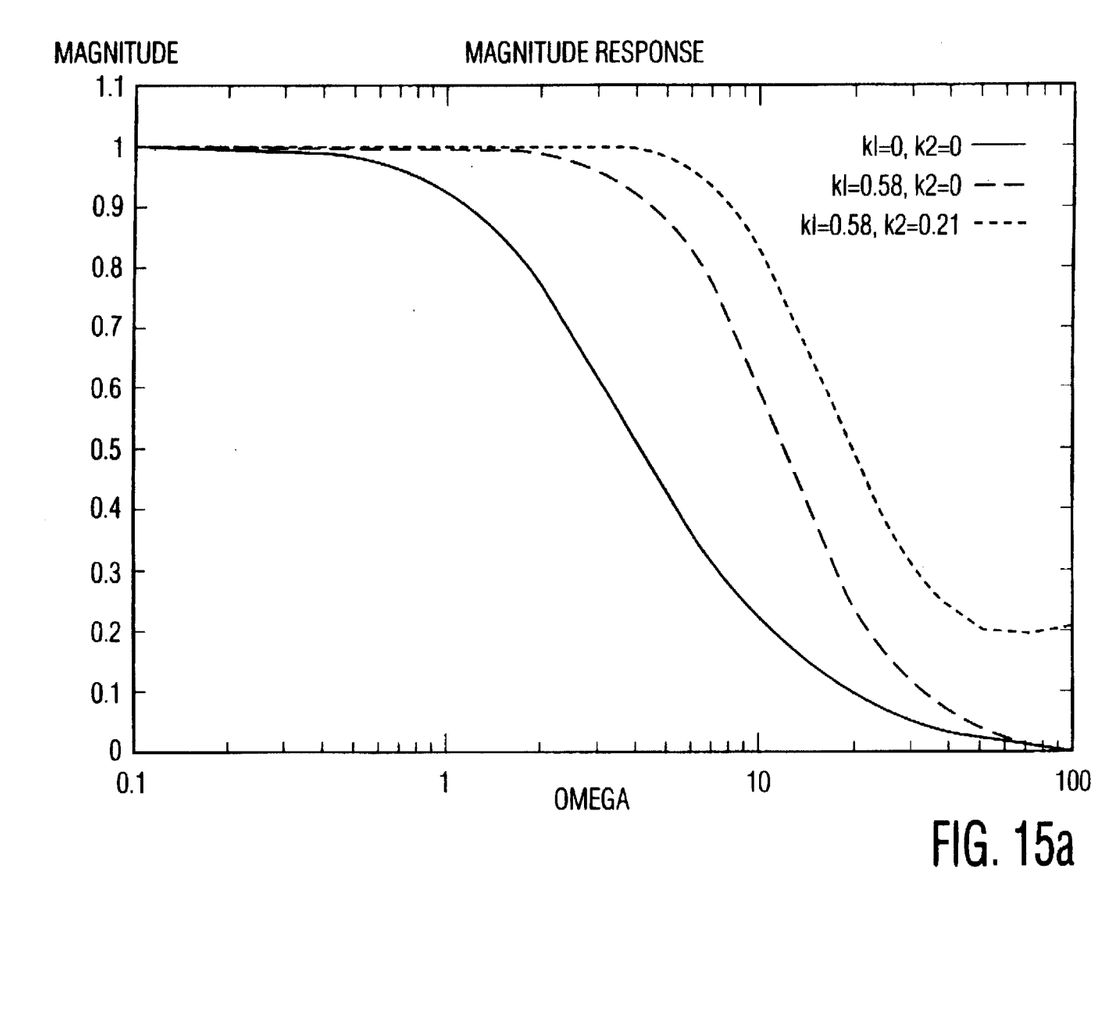
FIG. 15a is a graphical representation of the magnitude response for the circuit of FIG. 13.
Figure 15B:
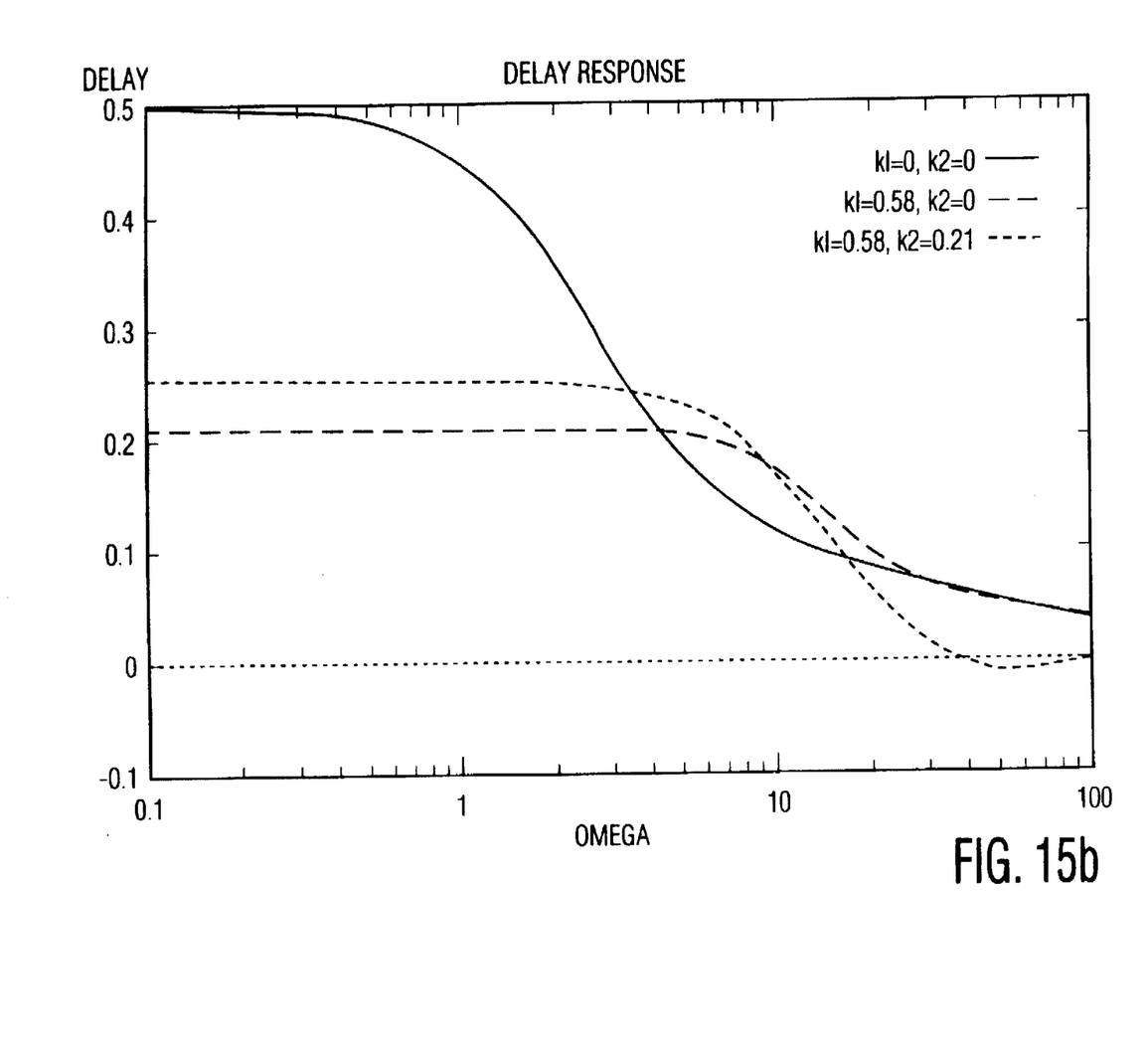
FIG. 15b is a graphical representation of the group delay response for the circuit of FIG. 13.

FIGS. 15a and 15b show graphical representations of the magnitude and group delay characteristics, respectively, that result from the transfer function of the circuit of FIG. 13 for varying values of k.

As with all previous filters, multiple delay cells like that shown in FIG. 13 can be coupled together to create a cascaded multiple stage delay cell based on the chosen application. Merging amplification stages can potentially simplify the circuit. This coupling would not necessarily reduce component count, but may reduce parasitic effects by eliminating intermediate summing points.

Another embodiment of a delay cell is shown in FIG. 14. Delay cell 800 is similar to delay cell 700 except that the delay cell portion 600 is replaced with the feedback configuration of circuit 90 of FIG. 9. The circuit of FIG. 14 can extend the delay time of the circuit of FIG. 9, just as the circuit of FIG. 13 extended the delay time of the circuit of FIG. 10.

Figure 16:
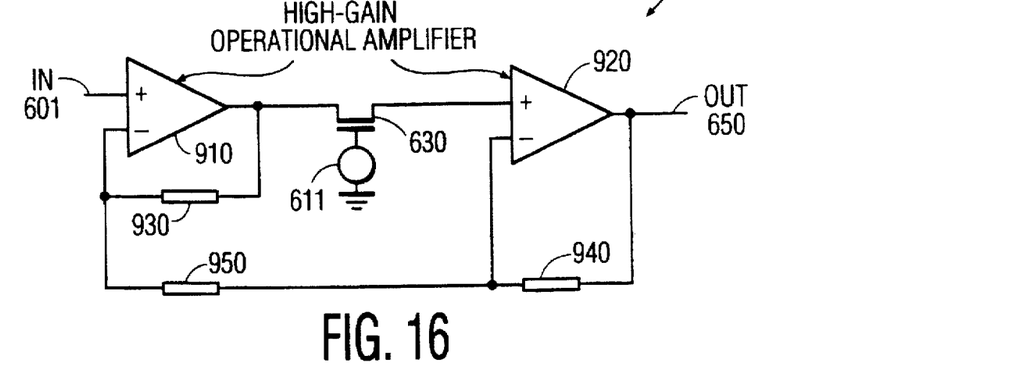
FIG. 16 is a schematic diagram of a specific implementation of the delay cell of FIG. 13 in accordance with the invention.

A further embodiment of a delay cell is shown in FIG. 16. Delay cell 900 illustrates a specific implementation of the delay cell of FIG. 13 using high-gain operational amplifiers 910 and 920 to efficiently replace the amplifiers and summing circuits utilized in the previous embodiments. Op-amp 910 has its non-inverting input terminal connected to continuous-time input signal. The output of op-amp 910 is connected to the source of transistor 630 and is fed back through resistive element 930 to the inverting terminal of op-amp 910. The gate of transistor 630 is coupled to DC voltage source 611 while the source of transistor 630 is coupled to the non-inverting input terminal of op-amp 920. The output terminal of op-amp 920 is fed back through a resistive element 940 to the inverting input of op-amp 920, and the inverting input of opamp 920 is also connected to the inverting input of opamp 910 via resistive element 950. In order to achieve substantially constant magnitude and delay frequency response characteristics, both the feedback and feedforward gains need to be optimized. These gains are set by ratios of the various resistors in FIG. 16. This optimization can be accomplished using a variety of numerical methods and optimization strategies.

The distributed delay cells'shown in FIGS. 8–10, 13, 14, and 16 are all based on exploiting the distributed resistance and capacitance within a single MOS transistor. The actual resistance and capacitance are electrically nonlinear, and this nonlinearity causes undesired signal distortion. A method for reducing signal distortion in distributed delay cells is to build them in balanced, or "differential," form, as follows.

Figure 17:
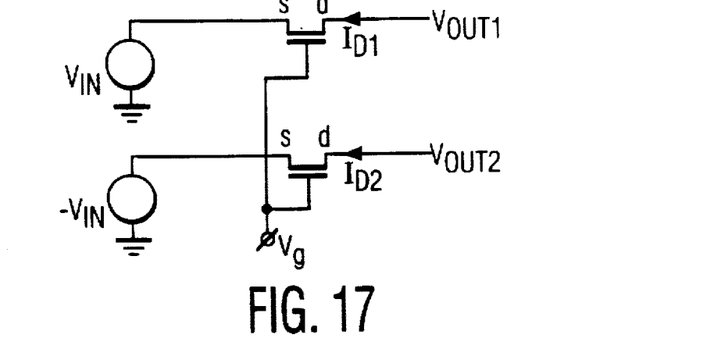
FIG. 17 is a schematic diagram of a balanced distributed MOS delay cell.

A rudimentary example of a balanced distributed MOS delay cell is shown in FIG. 17, analogous to the unbalanced circuit of FIG. 8. This illustrates the balancing principle that may be applied to all of the distributed delay cells. In FIG. 17, the input signal is applied as a balanced (or "differential") voltage at one end of the pair of MOSFET channels. The output signal is recovered as the voltage difference $V_{out1}-V_{out2}$, or alternatively, the output ends of the MOSFET channels may be returned to some low-impedance point, in which case the current difference $I_{D1}-I_{D2}$ becomes the output signal. In either case, the balanced arrangement tends to cancel some of the nonlinear distortion found in a single MOSFET, as in FIG. 8.

Figure 18:
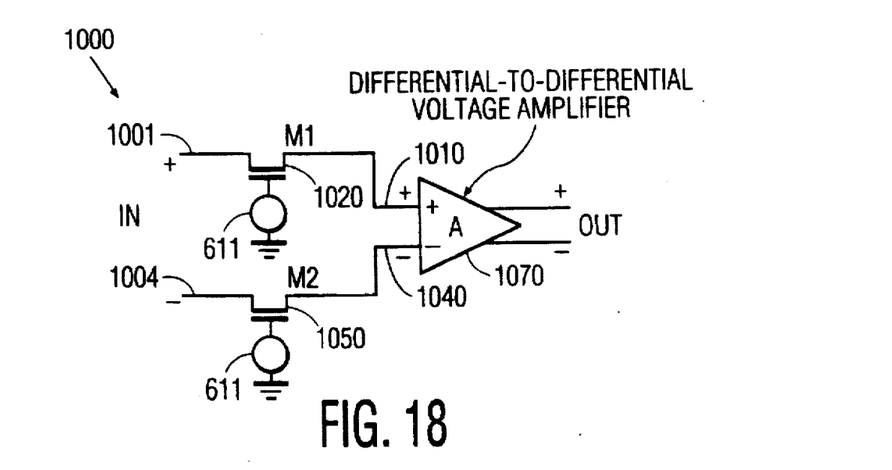
FIG. 18 is a schematic diagram of a fully differential circuit that can be applied to form a differential version of the circuit of FIG. 8.

FIG. 18 shows a fully differential circuit that can be applied to form differential versions of the delay cells already shown. Delay cell 1000 is shown using MOSFET devices 1020 and 1050. It should be understood that either NMOS or PMOS devices may be used to implement said delay cell. An actual RC network could also be used (i.e., either a distributed RC network or some approximation to it made from individual lumped resistors and capacitors), however, the RC network would not be tunable to cover a range of frequency scales with the same hardware.

Delay cell 1000 includes a positive input signal terminal 1001 connected to the source of a first MOSFET 1020. The gate of first MOSFET 1020 is coupled to a DC bias voltage source 611 while the drain is coupled to a first input terminal 1010 of differential-to-differential amplifier 1070 having a voltage gain of A. A negative input terminal 1004 is coupled to the source of a second MOSFET 1050 which has its gate coupled to DC bias voltage source 611 (or a second distinct DC bias source) and its drain coupled to a second input terminal 1040 of amplifier 1070. The DC bias sources 611 accomplish the electronic tuning of the delay cell.

The balanced configurations of FIGS. 17 and 18 admit extensions and variations, exactly as the configuration of FIG. 8 did, above-distributed delay cells could also, in principle, be built around any other manufacturable electronic component containing region that includes spatially distributed resistance and capacitance. One possible example would be junction field-effect transistors (JFETs), in which a conducting channel exhibits distributed resistance resembling that in a MOS transistor, and distributed capacitance due to back-biased p-n junctions.

Because the nonlinearity in distributed delay cells results from device physics and is not entirely under the designer's control, signal distortion may be too great for a particular application even with balanced configurations. Another potential limitation in distributed delay cells is their bandwidth. If these limitations are serious, the alternative class of lumped delay cells may be useful.

Figure 19:
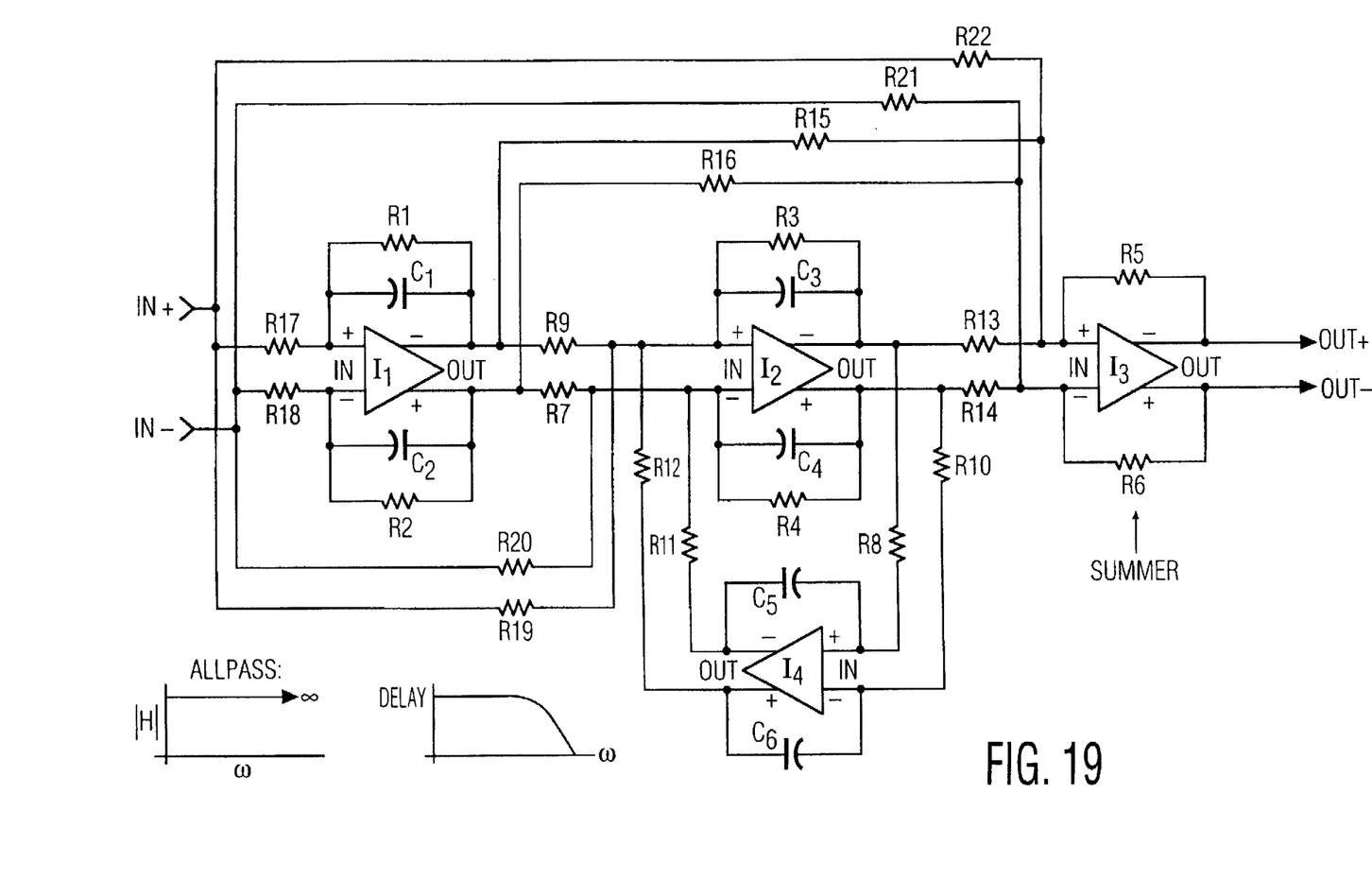
FIG. 19 is a schematic diagram of a third order lumped allpass delay cell according to the invention.

FIG. 19 shows an example of a lumped allpass delay circuit that approximates pure time delay via a standard Bessel transfer function. A Bessel transfer function is very useful for this purpose because it has a so-called maximally flat delay characteristic. Thus, such delay cells can be termed Bessel filters.

Generally, Bessel filters are lowpass filters, which are not suitable for application in the current invention. Thus, an allpass Bessel filter has been implemented, thereby providing twice the delay time and a theoretically infinite bandwidth.

A standard implementation of a lumped filter cell is a network of integrators. An often-used integrator implementation consists of a balanced op-amp with a feedback network that consists of two capacitors. A network of resistors (or resistive elements such as MOSFETs) realizes the intercoupling between the integrators.

FIG. 19 shows a third order delay cell in accordance with the lumped allpass embodiment. This means there are three integrators. One integrator consists of op-amp I1 and capacitors C1 and C2, the others are I2 with C3 and C4, and I4 with C5 and C6. Resistors R1–R4, R7–R12, and R17–R20, form a network to intercouple the integrators.

Figure 20:
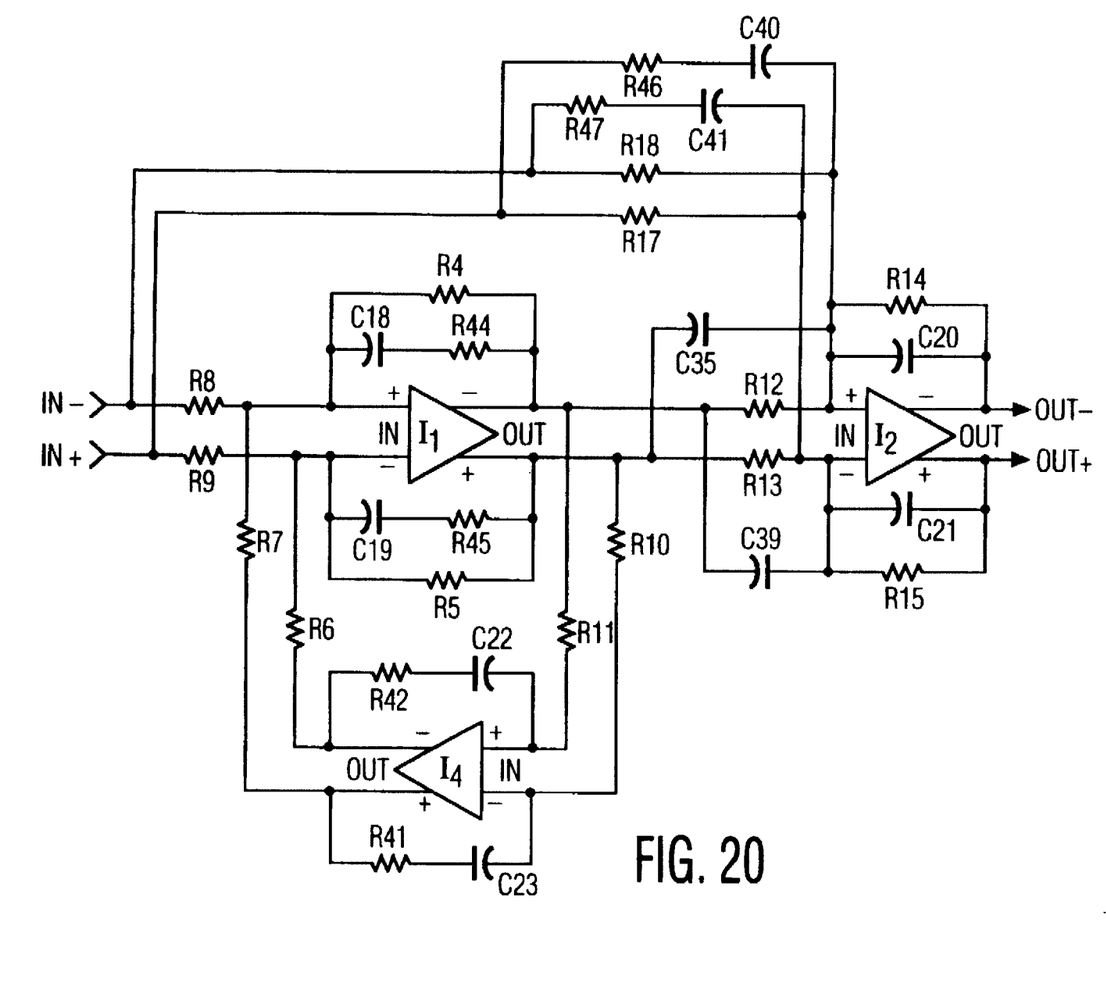
FIG. 20 is a schematic diagram of a simplified embodiment of a third-order lumped allpass delay cell according to the invention.

The circuit around op-amp I3 (together with R5, R6, R13–R16, R16, R21 and R22) is not an integrator, but a summer. In general, such a summer is necessary in filters with allpass characteristics. In order to reduce the number of op-amps, we have merged this summer with one of the integrators. This is depicted by the circuit of FIG. 20. The merged summer/integrator is realized around op-amp I2 with the capacitor/resistor network being specially designed to do the combined summing/integration operation.

In all of the above embodiments of delay cells, additional stages may be added in order to increase the delay. In this case, the gain coefficients or component values may be different for each stage.

While several embodiments of the present invention have been shown and described, it is to be understood that many changes and modifications may be made thereunto without departing from the spirit and scope of the invention as defined in the appended claims.

What is claimed is:

1. A monolithic continuous-time analog filter, comprising:
   a plurality of delay cells each having an input for receiving a continuous-time analog input signal, and an output for outputting a continuous-time internal signal, said delay cells each having delay parameters, said delays cells each comprising a continuum of semiconductor material between said cell input and said cell output, said continuum having a series resistance and parallel capacitance with an RC time constant determinative of the delay parameter of said each cell;
   a plurality of multiplier circuits each having its input coupled to the output of a delay cell, and having a weight coefficient, said continuous-time internal signals being multiplied by said weight coefficient to produce a plurality of weighted continuous-time internal signals; and
   summing means being coupled to said plurality of multiplier circuits for adding the weighted continuous time internal signals to generate a continuous-time output signal at its output, so that the monolithic continuous-time analog filter is responsive to the selected value of delay cell parameters and weight coefficients.

2. A filter according to claim 1, further comprising a pair of devices, each comprising a said continuum of series resistance and parallel capacitance, said devices being arranged as a differential pair.

3. The filter according to claim 1, wherein said plurality of delay cells comprises a multiple output filter.

4. A filter according to claim 1, further comprising means for inverting the delay cell input signal and adding the inverted input signal to the output of the delay cell.

5. The filter according to claim 1, wherein the value of said weight coefficients and said delay parameters are user-programmable.

6. The filter according to claim 5, wherein each of said delay cells comprises a MOS FET having a source, a drain, a gate, and a channel adjacent said gate extending between said source and drain, said channel comprising said continuum of series resistance and parallel capacitance.

7. The filter according to claim 5, wherein said weight coefficients are digitally programmed into each of said multipliers.

8. The filter according to claim 5, wherein said weight coefficients are analog signals programmed into each of said multipliers.

9. The filter according to claim 1, wherein a said delay cell comprises a J-FET having a conducting channel with distributed resistance and back-biased p-n junctions with distributed capacitance.

10. A filter according to claim 1, further comprising a tuning circuit electrically coupled to said delay cells for tuning the RC time constant and the delay parameter of said delay cells.

11. A filter according to claim 10, wherein said tuning circuit further comprises a feedback circuit coupled to the output of at least one delay cell.

12. A filter according to claim 10, wherein said tuning circuit comprises respective tuning circuits for respectively tuning each delay cell, said tuning circuits including a feedback circuit coupled to the output of at least one delay cell.

13. A filter according to claim 10, wherein at least one delay cell comprises a MOS FET having a source coupled as said cell input, a drain coupled as said cell output, a channel region extending between said source and said drain, and a gate, said channel region including said distributed resistance and capacitance, and said tuning circuit includes a voltage source applying a tuning voltage to at least one of said gate, source and drain to control the RC time constant and delay parameter of said at least one delay cell.

14. A filter according to claim 13, wherein said tuning circuit includes means for controlling the gate-source voltage $V_{GS}$ and the gate-to-drain voltage $V_{GD}$ of said MOS FET.

15. A filter according to claim 13, wherein said tuning circuit includes a feedback circuit coupling said cell output to said gate of said MOS FET.

16. A filter according to claim 13, wherein said tuning circuit includes a feedback circuit coupling said drain of said MOS FET to said source of said MOS FET.

17. A filter according to claim 13, further including a summing circuit having an output, an inverting input and a non-inverting input, a first amplifier having an input coupled for receiving the cell input signal and an output coupled to the inverting input of said summing circuit, a second amplifier having an input coupled to said drain and an output coupled to said non-inverting input of said summing circuit, the first and second amplifiers having gains respectively selected such that the delay parameter between said cell input and said cell output is greater than the delay parameter between said source and drain of said MOS FET.

18. A filter according to claim 13, comprising a pair of said MOS FET's arranged as a differential pair.

19. A monolithic continuous-time analog filter, comprising:

a body of semiconductor material; and integrated on said body of semiconductor material a plurality of delay cells, a plurality of multiplier circuits and summing means;

said plurality of delay cells each having an input for receiving a continuous-time analog input signal, an output for outputting a continuous-time internal signal, and an all-pass Bessel filter connected between said cell input and said cell output, said Bessel filter comprising a network of integrators coupled to each other;

said plurality of multiplier circuits each having its input coupled to the output of a delay cell, and having a weight coefficient, said continuous time internal signals being multiplied by said weight coefficient to produce a plurality of weighted continuous-time internal signals; and said summing means being coupled to said plurality of multiplier circuits for adding the weighted continuous time internal signals to generate a continuous-time output signal at its output, so that the monolithic continuous-time analog filter is responsive to the selected value of delay cell parameters and weight coefficients.

20. A filter according to claim 19, wherein said integrators each consist of a balanced op-amp and a capacitive feedback network for each integrator.

21. An electrically tunable monolithic delay circuit for outputting a plurality of delay signals each delayed in time relative to an input signal, said delay circuit comprising:

a body of semiconductor material;

a signal input for receiving an input signal;

a plurality of delay cells in said body of semiconductor material, each delay cell comprising a cell input coupled to said signal input, a cell output for outputting a delayed signal delayed in time relative to the input signal, and a continuum of series resistance and a continuum of parallel capacitance between said cell input and said cell output, said series resistance and parallel capacitance having a nominal RC time constant providing a nominal delay parameter for each delay cell; and a tuning circuit for electrically tuning the resistance of said continuum of series resistance of each said delay cell for tuning the delay parameter of said each delay cell.

22. A delay circuit according to claim 21, wherein said delay cells are coupled in series to said signal input, with the output of each delay cell being coupled to the input of the next succeeding delay cell of said plurality of delay cells.

23. A delay circuit according to claim 21, wherein said delay cells are coupled in parallel to said signal input, each delay cell having a unique delay parameter during operation of said delay circuit.

24. A delay circuit according to claim 21, wherein said tuning circuit further comprises a feedback circuit coupled to the output of a said delay cell.

25. A delay circuit according to claim 21, wherein said tuning circuit comprises a respective circuit for respectively tuning each delay cell, at least one of said tuning circuits including a feedback circuit coupled to the output of said at least one delay cell.

26. A filter according to claim 21, further comprising means for inverting the delay cell input signal and adding the inverted input signal to the to the output of the delay cell.

27. A filter according to claim 21, further comprising a pair of devices, each comprising a said continuum of series resistance and parallel capacitance, said devices being arranged as a differential pair.

28. A delay circuit according to claim 21, wherein at least one delay cell comprises a MOS FET having a source coupled as said cell input, a drain coupled as said cell output, a channel region extending between said source and said drain, and a gate, said channel region including said distributed resistance and capacitance, and said tuning circuit includes a voltage source applying a tuning voltage to at least one of said gate, source and drain to control the RC time constant and delay parameter of said at least one delay cell.

29. A delay circuit according to claim 28, wherein said tuning circuit includes a feedback circuit coupling said drain of said MOS FET to said source of said MOS FET.

30. A delay circuit according to claim 28, further including a summing circuit having an output, an inverting input and a non-inverting input, a first amplifier having an input coupled for receiving the cell input signal and an output coupled to the inverting input of said summing circuit, a second amplifier having an input coupled to said drain and an output coupled to said non-inverting input of said summing circuit, the first and second amplifiers having gains respectively selected such that the delay parameter between said cell input and said cell output is greater than the delay parameter between said source and drain of said MOS FET.

31. A filter according to claim 28, comprising a pair of said MOS FET's arranged as a differential pair.

32. A delay circuit according to claim 28, wherein said tuning circuit includes means for controlling the gate-source voltage $V_{GS}$ and the gate-to-drain voltage $V_{GD}$ of said MOS FET.

33. A delay circuit according to claim 28, wherein said tuning circuit includes a feedback circuit coupling said cell output to said gate of said MOS FET.

* * * * *